United States Patent
Lin et al.

(10) Patent No.: US 11,789,511 B2
(45) Date of Patent: Oct. 17, 2023

(54) SYSTEM AND METHOD OF DETERMINING AN ISSUE ASSOCIATED WITH A POWER DISTRIBUTION SYSTEM OF AN INFORMATION HANDLING SYSTEM

(71) Applicant: Dell Products L.P., Round Rock, TX (US)

(72) Inventors: Yong-Teng Lin, Yilan County (TW); Jui-Chin Fang, Taipei (TW); Chi Che Wu, Taipei (TW); Wei Cheng Yu, New Taipei (TW); Geroncio Tan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 188 days.

(21) Appl. No.: 17/451,968

(22) Filed: Oct. 22, 2021

(65) Prior Publication Data
US 2023/0131113 A1    Apr. 27, 2023

(51) Int. Cl.
*G06F 1/28*      (2006.01)
*H02J 7/00*      (2006.01)
*G01R 19/165*    (2006.01)
*G01R 19/10*     (2006.01)

(52) U.S. Cl.
CPC ............... *G06F 1/28* (2013.01); *G01R 19/10* (2013.01); *G01R 19/1659* (2013.01); *H02J 7/00032* (2020.01); *H02J 7/0047* (2013.01); *H02J 7/00712* (2020.01)

(58) Field of Classification Search
CPC ....... G01R 19/10; G01R 19/1659; G06F 1/26; G06F 1/28; H02J 7/00032; H02J 7/0047; H02J 7/00712
See application file for complete search history.

(56) References Cited

U.S. PATENT DOCUMENTS

| | | | |
|---|---|---|---|
| 11,086,390 B2 * | 8/2021 | Cook | G06F 1/30 |
| 2018/0183251 A1 * | 6/2018 | Kawasaki | G01R 31/3648 |
| 2022/0404423 A1 * | 12/2022 | Chang | H02J 7/0047 |

OTHER PUBLICATIONS

ISL9538B—Buck-Boost Narrow VDC Battery Charger with SMBus Interface, Data Short, Rev. 1.00, Renesas, Oct. 24, 2019.

* cited by examiner

*Primary Examiner* — Terrell S Johnson
(74) *Attorney, Agent, or Firm* — McDermott Will & Emery LLP

(57) ABSTRACT

In one or more embodiments, one or more systems, one or more methods, and/or one or more processes may: send, by a battery management unit (BMU) of a battery of an information handling system (IHS), a request for a first amount of current to an embedded controller (EC) of the IHS; provide, by the EC, the request for the first amount of current to a charger of the IHS; receive, by the charger, the request; provide, by the charger, a second amount of current based at least on the request and based at least on a voltage measurement across a resistor of the charger; determine, by the BMU, a measurement of the second amount of current; provide, by the BMU, the measurement to the EC; determine, by the EC, that the measurement does not match the first amount of current; and provide, by the EC, an alert.

20 Claims, 10 Drawing Sheets

FIG. 6B

SYSTEM AND METHOD OF DETERMINING AN ISSUE ASSOCIATED WITH A POWER DISTRIBUTION SYSTEM OF AN INFORMATION HANDLING SYSTEM

BACKGROUND

Field of the Disclosure

This disclosure relates generally to information handling systems and more particularly to determining an issue associated with a power distribution system of an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments, one or more systems, one or more methods, and/or one or more processes may send, by a battery management unit of a battery of an information handling system, a request for a first amount of current to an embedded controller of the information handling system; may provide, by the embedded controller, the request for the first amount of current to a charger of the information handling system; may receive, by the charger, the request for the first amount of current; may provide, by the charger to the battery, a second amount of current based at least on the request for the first amount of current and based at least on a voltage measurement across a resistor of the charger; may determine, by the battery management unit, a measurement of the second amount of current; may provide, by the battery management unit, the measurement of the second amount of current to the embedded controller; may determine, by the embedded controller, that the measurement of the second amount of current does not match the first amount of current; and may provide, by the embedded controller, an alert. In one or more embodiments, providing the alert may be performed in response to determining that the measurement of the second amount of current does not match the first amount of current.

In one or more embodiments, a processor of the information handling system, which would execute an operating system with a graphical user interface after booting the operating system, is not processing instructions. In one or more embodiments, the information handling system may include an inter-integrated circuit ($I^2C$) bus. For example, providing the request for the amount of current to the charger may include providing the request for the amount of current to the charger via the $I^2C$ bus. In one or more embodiments, the alert may indicate a problem associated with the resistor of the charger. In one or more embodiments, the one or more systems, the one or more methods, and/or the one or more processes may further determine, by the charger, the voltage measurement across the resistor of the charger.

In one or more embodiments, the one or more systems, the one or more methods, and/or the one or more processes may further determine, by the charger, the measurement of the second amount of current; determine, by the charger, that the measurement of the second amount of current does not match the first amount of current; and in response to determining, by the charger, that the measurement of the second amount of current does not match the first amount of current, provide, by the charger, the alert. In one or more embodiments, determining that the measurement of the second amount of current does not match the first amount of current may include determining that the measurement of the second amount of current is outside a range of a tolerance of the first amount of current.

In one or more embodiments, a battery management unit may: send a request for a first amount of current to an embedded controller of an information handling system; receive, from a charger of the information handling system, a second amount of current based at least on the request for the first amount of current and based at least on a voltage measurement across a resistor of the charger; determine a measurement of the second amount of current; determine that the measurement of the second amount of current does not match the first amount of current; and provide an alert. In one or more embodiments, providing the alert may be performed in response to determining that the measurement of the second amount of current does not match the first amount of current, In one or more embodiments, to provide the alert, the battery management unit may further provide the alert before a processor of the information handling system boots an operating system with a graphical user interface. In one or more embodiments, to send the request for the first amount of current to the embedded controller, the battery management unit may further send the request for the first amount of current to the embedded controller via an $I^2C$ bus. In one or more embodiments, the alert may indicate a problem associated with the resistor of the charger. In one or more embodiments, to determine that the measurement of the second amount of current does not match the first amount of current, the battery management unit may further determine that the measurement of the second amount of current is outside a range of a tolerance of the first amount of current. In one or more embodiments, to provide the alert, battery management unit may further provide the alert to the embedded controller.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which:

FIGS. 6B and 6C illustrate an example of data packets of a power supply interacting with an information handling system, according to one or more embodiments;

DETAILED DESCRIPTION

Figure 1A:
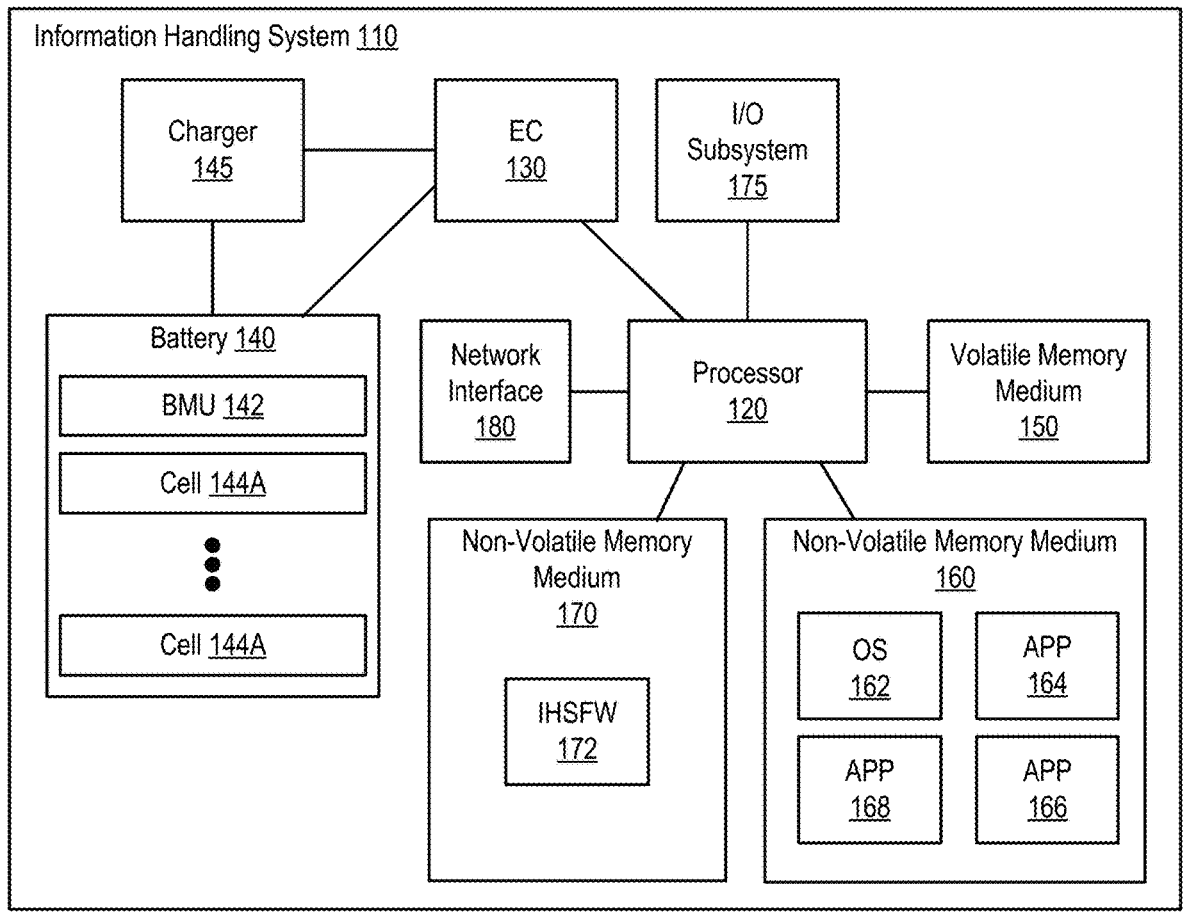
FIG. 1A illustrates an example of an information handling system, according to one or more embodiments.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

In one or more embodiments, an information handling system may receive power via an interface. For example, a power supply may provide power to the information handling system via the interface. In one instance, the information handling system may receive power from the power supply via a universal serial bus (USB) interface. In another instance, the information handling system may receive power from the power supply via a Thunderbolt interface. In one or more embodiments, the information handling system may determine an amount of power that can be drawn from the interface. For example, the information handling system may determine an amount of power that can be drawn from the power supply. For instance, the information handling system may request the amount of power from the power supply. In one or more embodiments, as the information handling system draws power from the power supply, the information handling system may determine a measurement of an amount of power drawn from the power supply. For example, the information handling system may compare the measurement of the amount of power drawn from the power supply with an amount of power requested from the power supply. For instance, if the measurement of the amount of power drawn from the power supply does not match the amount of power requested from the power supply, an alert may be provided.

In one or more embodiments, determining if the measurement of the amount of power drawn from the power supply does not match the amount of power requested from the power supply, may include determining if the measurement of the amount of power drawn from the power supply does not match the amount of power requested from the power supply within a threshold range. For example, the threshold range may be a few Watts. As an example, if the measurement of the amount of power drawn from the power supply does not match the amount of power requested from the power supply within plus or minus a threshold (e.g., five Watts (5 W)), it may be determined that the measurement of the amount of power drawn from the power supply does not match the amount of power requested from the power supply. In one instance, if the measurement of the amount of power drawn from the power supply is the threshold (e.g., five Watts (5 W)) below the amount of power requested from the power supply, it may be determined that the measurement of the amount of power drawn from the power supply does not match the amount of power requested from the power supply. In another instance, if the measurement of the amount of power drawn from the power supply is the threshold (e.g., five Watts (5 W)) above the amount of power requested from the power supply, it may be determined that the measurement of the amount of power drawn from the power supply does not match the amount of power requested from the power supply.

In one or more embodiments, if the measurement of the amount of power drawn from the power supply does not match the amount of power requested from the power supply, there may be an issue associated with one or more portions of a power distribution system of the information handling system. For example, there may be an issue associated with a charger of the power distribution system of the information handling system. In one or more embodiments, the charger may utilize one or more components. For example, the one or more components of the charger may include one or more resistors, one or more capacitors, one or more inductors, and/or one or more transistors, among others. For instance, if the measurement of the amount of power drawn from the power supply does not match the amount of power requested from the power supply, there may be an issue associated with the one or more components of the charger. As one example, the issue associated with the one or more components of the charger may include a faulty component. As another example, the issue associated with the one or more components of the charger may include an installation issue associated with a component. In one instance, an installation issue associated with the component may cause the component to not operate properly. In another instance, an installation issue associated with the component may cause the component to not operate within an expected tolerance of the component. As an example, if the component does not operate within the expected tolerance of the component, the charger may not operate within an expected tolerance of the charger.

Turning now to FIG. 1A, an example of an information handling system is illustrated, according to one or more embodiments. An information handling system (IHS) 110 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 110 may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS 110 may include or have a form factor of that of or similar to one or more of a laptop, a notebook, a telephone, a tablet, and a PDA, among others. For example, a portable IHS 110 may be readily carried and/or transported by a user (e.g., a person). In one or more embodiments, components of IHS 110 may include one or more storage devices, one or more communications ports for communicating with external devices as well as various input and output (I/O) devices, such as a keyboard, a mouse, and a video display, among others. In one or more embodiments, IHS 110 may include one or more buses operable to transmit communication between or among two or more hardware components. In one example, a bus of IHS 110 may include one or more of a memory bus, a peripheral bus, and a local bus, among others. In another example, a bus of IHS 110 may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 110 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 110 may include a processor 120, an embedded controller (EC) 130, a volatile memory medium 150, non-volatile memory media 160 and 170, an I/O subsystem 175, and a network interface 180. As illustrated, EC 130, volatile memory medium 150, non-volatile memory media 160 and 170, I/O subsystem 175, and network interface 180 may be communicatively coupled to processor 120.

In one or more embodiments, one or more of EC 130, volatile memory medium 150, non-volatile memory media 160 and 170, I/O subsystem 175, and network interface 180 may be communicatively coupled to processor 120 via one or more buses, one or more switches, and/or one or more root complexes, among others. In one example, one or more of EC 130, volatile memory medium 150, non-volatile memory media 160 and 170, I/O subsystem 175, and network interface 180 may be communicatively coupled to processor 120 via one or more PCI-Express (PCIe) root complexes. In another example, one or more of EC 130, I/O subsystem 175, and network interface 180 may be communicatively coupled to processor 120 via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 150 may include volatile storage such as, for example, RAM, DRAM (dynamic RAM), EDO RAM (extended data out RAM), SRAM (static RAM), etc. One or more of non-volatile memory media 160 and 170 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 180 may be utilized in communicating with one or more networks and/or one or more other information handling systems. In one example, network interface 180 may enable IHS 110 to communicate via a network utilizing a suitable transmission protocol and/or standard. In a second example, network interface 180 may be coupled to a wired network. In a third example, network interface 180 may be coupled to an optical network. In another example, network interface 180 may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, network interface 180 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 120 may execute processor instructions in implementing at least a portion of one or more systems, at least a portion of one or more flowcharts, at least a portion of one or more methods, and/or at least a portion of one or more processes described herein. In one example, processor 120 may execute processor instructions from one or more of memory media 150, 160, and 170 in implementing at least a portion of one or more systems, at least a portion of one or more flowcharts, at least a portion of one or more methods, and/or at least a portion of one or more processes described herein. In another example, processor 120 may execute processor instructions via network interface 180 in implementing at least a portion of one or more systems, at least a portion of one or more flowcharts, at least a portion of one or more methods, and/or at least a portion of one or more processes described herein.

In one or more embodiments, processor 120 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 120 may interpret and/or execute program instructions and/or process data stored locally (e.g., via memory media 150, 160, and 170 and/or another component of IHS 110). In another example, processor 120 may interpret and/or execute program instructions and/or process data stored remotely (e.g., via a network storage resource).

In one or more embodiments, I/O subsystem 175 may represent a variety of communication interfaces, graphics interfaces, video interfaces, user input interfaces, and/or peripheral interfaces, among others. For example, I/O subsystem 175 may include one or more of a touch panel and a display adapter, among others. For instance, a touch panel may include circuitry that enables touch functionality in conjunction with a display that is driven by a display adapter.

As shown, non-volatile memory medium 160 may include an operating system (OS) 162, and applications (APPs) 164-168. In one or more embodiments, one or more of OS 162 and APPs 164-168 may include processor instructions executable by processor 120. In one example, processor 120 may execute processor instructions of one or more of OS 162 and APPs 164-168 via non-volatile memory medium 160. In another example, one or more portions of the processor instructions of the one or more of OS 162 and APPs 164-168 may be transferred to volatile memory medium 150, and processor 120 may execute the one or more portions of the processor instructions of the one or more of OS 162 and APPs 164-168 via volatile memory medium 150.

As illustrated, non-volatile memory medium 170 may include information handling system firmware (IHSFW) 172. In one or more embodiments, IHSFW 172 may include processor instructions executable by processor 120. For example, IHSFW 172 may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, processor 120 may execute processor instructions of IHSFW 172 via non-volatile memory medium 170. In another instance, one or more portions of the processor instructions of IHSFW 172 may be transferred to volatile memory medium 150, and processor 120 may execute the one or more portions of the processor instructions of IHSFW 172 via volatile memory medium 150.

In one or more embodiments, OS 162 may include a management information exchange. In one example, the management information exchange may permit multiple components to exchange management information associated with managed elements and/or may permit control and/or management of the managed elements. In another example, the management information exchange may include a driver and/or a driver model that may provide an OS interface through which managed elements (e.g., elements of IHS 110) may provide information and/or notifications, among others. In one instance, the management information exchange may be or include a Windows Management Interface (WMI) for ACPI (available from Microsoft Corporation). In another instance, the management information exchange may be or include a Common Information Model (CIM) (available via the Distributed Management Task Force). In one or more embodiments, the management information exchange may include a combination of the WMI and the CIM. For example, WMI may be and/or may be utilized as an interface to the CIM. For instance, the WMI may be utilized to provide and/or send CIM object information to OS 162.

In one or more embodiments, processor 120 and one or more components of IHS 110 may be included in a system-on-chip (SoC). For example, the SoC may include processor 120 and a platform controller hub (not specifically illustrated).

In one or more embodiments, EC 130 may be or include a remote access controller. For example, the remote access controller may be or include a DELL™ Remote Access Controller (DRAC). In one or more embodiments, a remote access controller may be integrated into IHS 110. For example, the remote access controller may be or include an integrated DELL™ Remote Access Controller (iDRAC). In one or more embodiments, a remote access controller may include one or more of a processor, a memory, and a network interface, among others. In one or more embodiments, a remote access controller may access one or more busses and/or one or more portions of IHS 110. For example, the remote access controller may include and/or may provide power management, virtual media access, and/or remote console capabilities, among others, which may be available via a web browser and/or a command line interface. For instance, the remote access controller may provide and/or permit an administrator (e.g., a user) one or more abilities to configure and/or maintain an information handling system as if the administrator was at a console of the information handling system and/or had physical access to the information handling system.

In one or more embodiments, a remote access controller may interface with baseboard management controller integrated circuits. In one example, the remote access controller may be based at least on an Intelligent Platform Management Interface (IPMI) standard. For instance, the remote access controller may allow and/or permit utilization of IPMI out-of-band interfaces such as IPMI Over LAN (local area network). In another example, the remote access controller may be based at least on a Redfish standard. In one instance, one or more portions of the remote access controller may be compliant with one or more portions of a Redfish standard. In another instance, one or more portions of the remote access controller may implement one or more portions of a Redfish standard. In one or more embodiments, a remote access controller may include and/or provide one or more internal private networks. For example, the remote access controller may include and/or provide one or more of an Ethernet interface, a front panel USB interface, and a Wi-Fi interface, among others. In one or more embodiments, a remote access controller may be, include, or form at least a portion of a virtual KVM (keyboard, video, and mouse) device. For example, a remote access controller may be, include, or form at least a portion of a KVM over IP (IPKVM) device. For instance, a remote access controller may capture video, keyboard, and/or mouse signals; may convert the signals into packets; and may provide the packets to a remote console application via a network.

In one or more embodiments, EC 130 may be or include a microcontroller. For example, the microcontroller may be or include an 8051 microcontroller, an ARM Cortex-M (e.g., Cortex-M0, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. In one or more embodiments, EC 130 may be or include an application processor. In one example, EC 130 may be or include an ARM Cortex-A processor. In another example, EC 130 may be or include an Intel Atom processor. In one or more embodiments, EC 130 may be or include one or more of a field programmable gate array (FPGA) and an ASIC, among others, configured, coded, and/or encoded with instructions in accordance with at least a portion of one or more of systems, at least a portion of one or more flowcharts, at least a portion of one or more methods, and/or at least a portion of one or more processes described herein.

In one or more embodiments, IHS 110 may include a battery 140. For example, battery 140 may provide electrical power to one or more components of IHS 110. For instance, the one or more components of IHS 110 may include one or more of processor 120, EC 130, a charger 145, volatile memory medium 150, non-volatile memory medium 160, non-volatile memory medium 170, I/O subsystem 175, and network interface 180, among others. In one or more embodiments, battery 140 may include a battery management unit (BMU) 142 and cells 144A-144N. For example, cells 144A-144N may store chemical energy, which may be converted into electrical power. For instance, one or more portions cells 144A-144N may arranged in series and/or parallel to deliver the electrical power. Although battery 140 is illustrated as including cells 144A-144N, battery 140 may include any number of cells 140, according to one or more embodiments. In one or more embodiments, IHS 110 may include charger 145. For example, charger 145 may receive electrical power from a power supply 194, illustrated in FIG. 1B. For instance, charger 145 may be coupled to power supply 194. In one or more embodiments, charger may provide electrical power to battery 140 and/or one or more components of IHS 110.

Figure 1B:
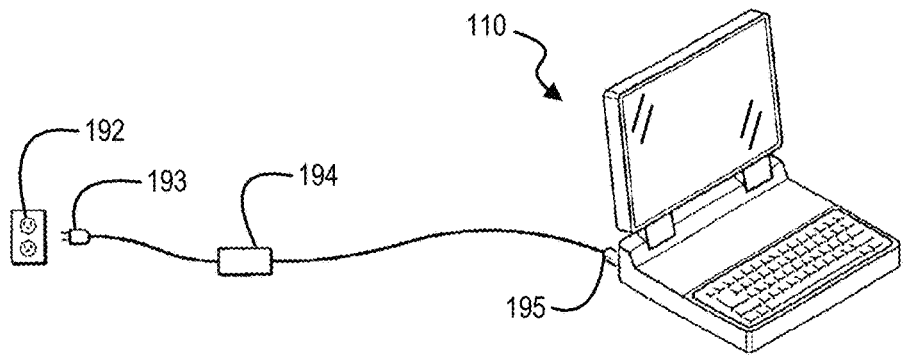
FIG. 1B illustrates another example of an information handling system, according to one or more embodiments.

Turning now to FIG. 1B, another example of an information handling system is illustrated, according to one or more embodiments. In one or more embodiments, IHS 110 may utilize power supply 194. For example, power supply 194 may utilize alternating current (AC) from an AC socket 192. For instance, power supply 194 may be coupled to a plug 193, which may be plugged into socket 192. In one or more embodiments, power supply 194 may be coupled to a plug 195, which may be plugged into IHS 110. For example, IHS 110 may include a socket, which may receive plug 195. For instance, the socket may be coupled to charger 145. In one or more embodiments, power supply 194 may be external to IHS 110. Although not specifically illustrated, IHS 110 may include power supply 194, according to one or more embodiments.

Figure 2A:
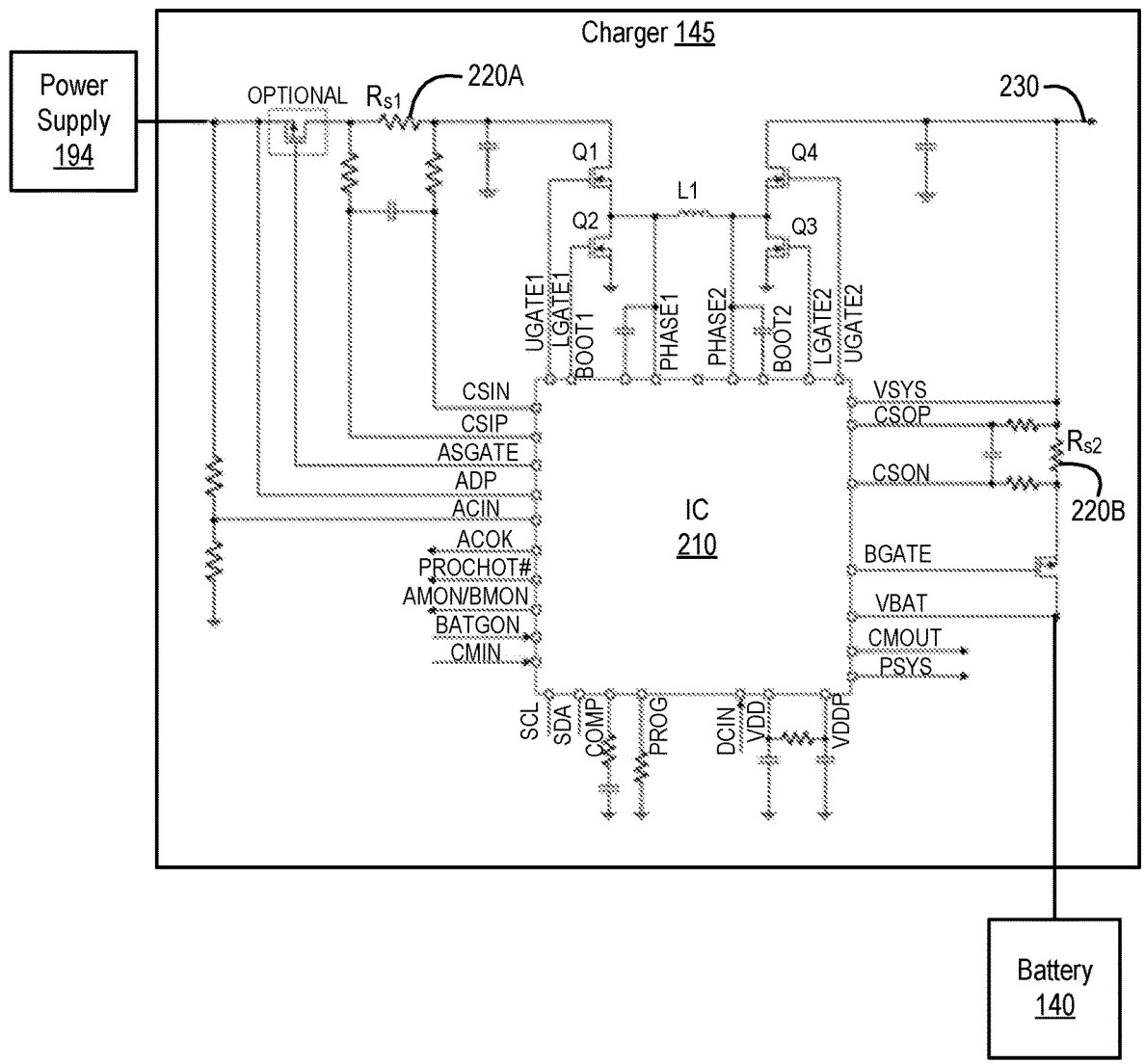
FIG. 2A illustrates an example of a charger, according to one or more embodiments.

Turning now to FIG. 2A, an example of a charger is illustrated, according to one or more embodiments. In one or more embodiments, charger 145 may include an integrated circuit (IC) 210. In one example, IC 210 may be coupled to power supply 194. In another example, IC 210 may be coupled to battery 140. In one or more embodiments, IC 210 may be coupled to one or more resistors. For example, IC 210 may be coupled to resistors 220A and 220B. For instance, IC 210 may utilize one or more of resistors 220A and 220B to determine an amount of current. As an example, determining an amount of current may include measuring an amount of current. For instance, IC 210 may utilize one or more of resistors 220A and 220B to measure an amount of current. In one or more embodiments, IC 210 may provide electrical power to one or more components of IHS 110 via a lead 230.

Figure 2B:
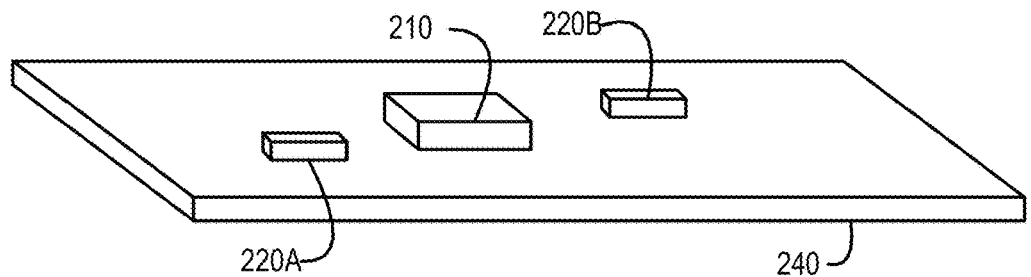
FIG. 2B illustrates an example of a charger and resistors mounted on a printed circuit board, according to one or more embodiments.

Turning now to FIG. 2B, an example of a charger and resistors mounted on a printed circuit board is illustrated, according to one or more embodiments. In one or more embodiments, IC 210 and resistors 220A and 220B may be mounted on a printed circuit board (PCB) 240. For example, IC 210 and resistors 220A and 220B may be soldered to PCB 240. For instance, IC 210 and resistors 220A and 220B may be soldered to pads of PCB 240. Although not specifically illustrated, other components of charger 145 shown in FIG. 2A may be mounted to a PCB, such as PCB 240, according to one or more embodiments.

Figure 2C:
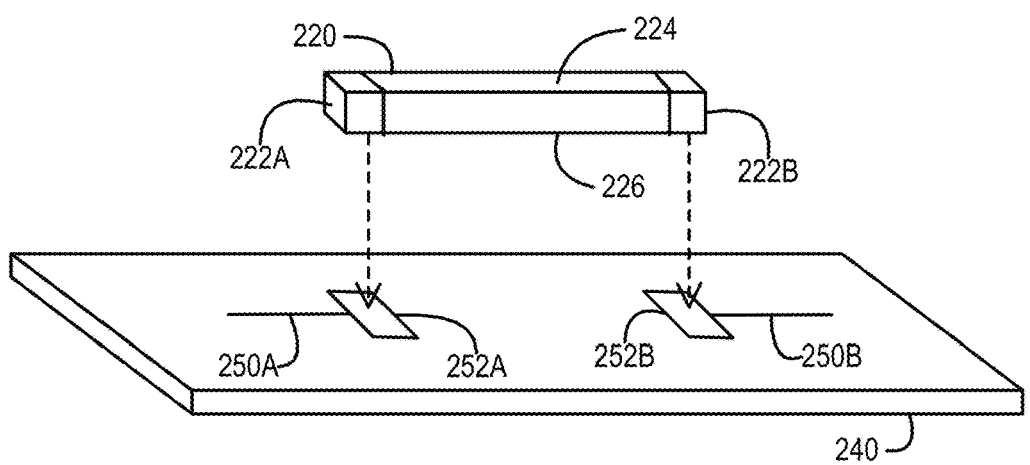
FIGS. 2C and 2D illustrate examples of mounting a resistor on a printed circuit board, according to one or more embodiments.
Figure 2D:
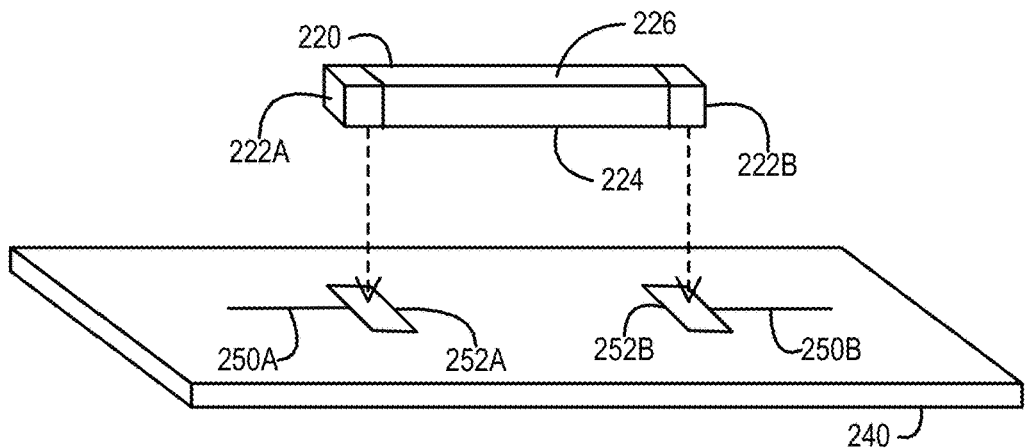

Turning now to FIGS. 2C and 2D, examples of mounting a resistor on a printed circuit board are illustrated, according to one or more embodiments. In one or more embodiments, a resistor 220 may include metallic conductors 222A and 222B. For example, metallic conductors 222A and 222B may respectively be soldered to pads 252A and 252B of PCB 240. In one or more embodiments, resistor 220 may include sides. For example, resistor 220 may include sides 224 and 226. For instance, side 224 may be opposite to side 226. As an example, metallic conductors 222A and 222B may respectively be soldered to pads 252A and 252B of PCB 240 such that side 224 is away from PCB 240 and side 226 is towards PCB 240, as shown in FIG. 2C. As another example, metallic conductors 222A and 222B may respectively be soldered to pads 252A and 252B of PCB 240 such that side 226 is away from PCB 240 and side 224 is towards PCB 240, as shown in FIG. 2D.

In one or more embodiments, when metallic conductors 222A and 222B are respectively soldered to pads 252A and 252B of PCB 240, a resistance value may be determined between traces 250A and 250B of PCB 240. For example, traces 250A and 250B may be respectively coupled to soldered to pads 252A and 252B. For instance, traces 250A and 250B may include metallic conductors. In one instance, metallic conductors 222A and 222B may respectively be soldered to pads 252A and 252B of PCB 240 such that side 224 is away from PCB 240 and side 226 is towards PCB 240, as shown in FIG. 2C, and a first resistance value may be determined between traces 250A and 250B of PCB 240. In another instance, metallic conductors 222A and 222B may respectively be soldered to pads 252A and 252B of PCB 240 such that side 226 is away from PCB 240 and side 224 is towards PCB 240, as shown in FIG. 2D, and a second resistance value may be determined between traces 250A and 250B of PCB 240.

In one or more embodiments, the second resistance value may be different from the first resistance value. For example, when metallic conductors 222A and 222B are respectively soldered to pads 252A and 252B of PCB 240, a resistance value between traces 250A and 250B of PCB 240 may be based at least on an orientation of resistor 220 mounted to PCB 240. For instance, when metallic conductors 222A and 222B are respectively soldered to pads 252A and 252B of PCB 240, a resistance value between traces 250A and 250B of PCB 240 may be affected by an orientation of resistor 220 mounted to PCB 240. In one or more embodiments, when the second resistance value is different from the first resistance value, the second resistance value may be outside a tolerance of an expected resistance value (e.g., the first resistance value). For example, an orientation of resistor 220 mounted to PCB 240 may cause resistor 220 to be outside an expected resistance value of resistor 220.

In one or more embodiments, IC 210 may be coupled to traces 250A and 250B of PCB 240, although not specifically illustrated. In one example, IC 210 may be directly coupled to traces 250A and 250B of PCB 240. In another example, IC 210 may be indirectly coupled to traces 250A and 250B of PCB 240. In one instance, IC 210 may be coupled to traces 250A and 250B of PCB 240 with one or more electrical components interposing IC 210 and at least one of traces 250A and 250B of PCB 240. In another instance, IC 210 may be coupled to traces 250A and 250B of PCB 240 via one or more electrical components.

In one or more embodiments, IC 210 may utilize resistor 220 to determine an amount of current. For example, a determination of the amount of current may be based at least on an orientation of resistor 220 mounted to PCB 240. For instance, a determination of the amount of current may be affected by an orientation of resistor 220 mounted to PCB 240. As an example, when metallic conductors 222A and 222B are respectively soldered to pads 252A and 252B of PCB 240 such that side 224 is away from PCB 240 and side 226 is towards PCB 240, as shown in FIG. 2C, and IC 210 may utilize resistor 220 to determine a first amount of current. As another example, when metallic conductors 222A and 222B are respectively soldered to pads 252A and 252B of PCB 240 such that side 226 is away from PCB 240 and side 224 is towards PCB 240, as shown in FIG. 2D, and IC 210 may utilize resistor 220 to determine a second amount of current. In one or more embodiments, the second amount of current may not match the first amount of current.

For example, the second amount of current may be different from the first amount of current. In one or more embodiments, when IC 210 utilizes resistor 220 to determine an amount of current, IC 210 may incorrectly determine the amount of current based at least on an orientation of resistor 220. For example, if there is a difference in resistance between traces 250A and 250B based at least on an orientation of resistor 220, IC 210 may incorrectly determine the amount of current based at least on the orientation of resistor 220. For instance, if an orientation of resistor 220 causes resistance between traces 250A and 250B to be outside a tolerance, IC 210 may incorrectly determine the amount of current based at least on the orientation of resistor 220.

Figure 3:
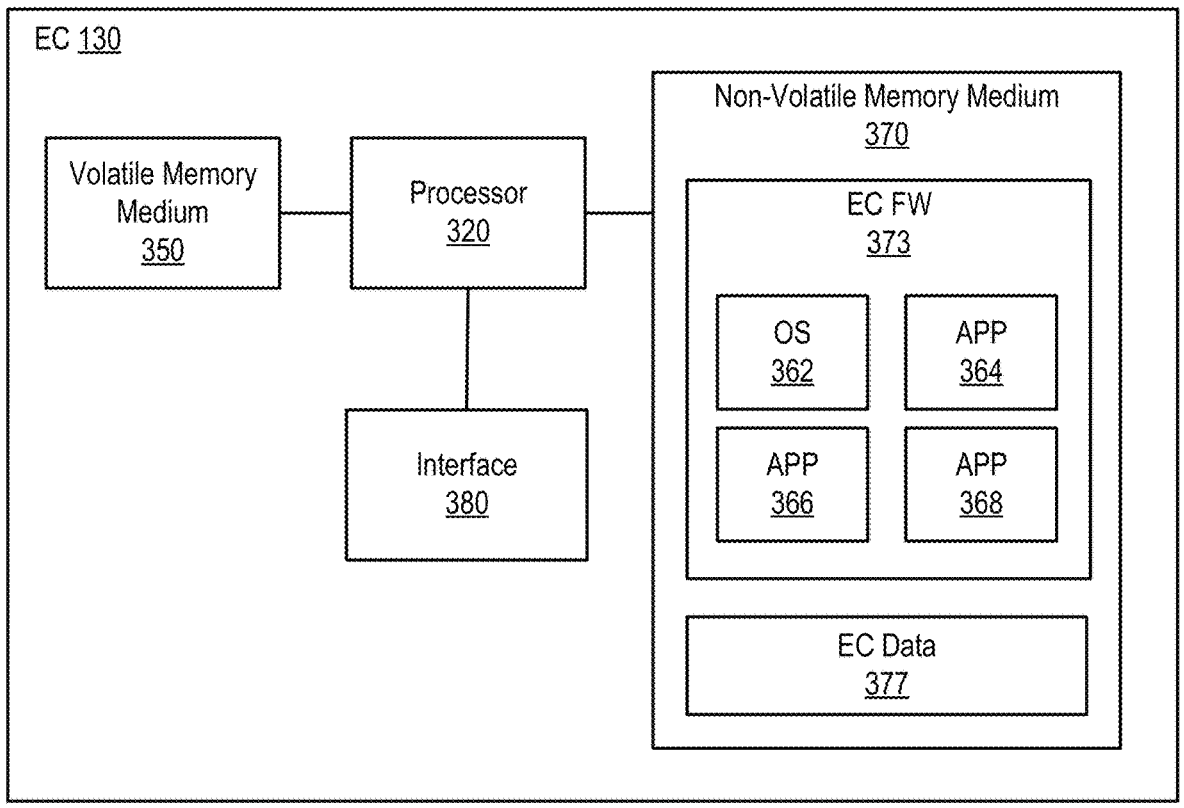
FIG. 3 illustrates an example of an embedded controller, according to one or more embodiments.

Turning now to FIG. 3, an example of an embedded controller is illustrated, according to one or more embodiments. As shown, EC 130 may include a processor 320, a volatile memory medium 350, a non-volatile memory medium 370, and an interface 380. As illustrated, non-volatile memory medium 370 may include a EC firmware (FW) 373, which may include an OS 362 and APPs 364-368, and may include EC data 377. In one example, OS 362 may be or include a real-time operating system (RTOS). For instance, the RTOS may be or include FreeRTOS, OpenR-TOS, SafeRTOS, QNX, ThreadX, VxWorks, NuttX, TI-RTOS, eCos, MicroC/OS, or Zephyr, among others. In a second example, OS 362 may be or include an Unix-like operating system. For instance, the Unix-like operating system may be or include LINUX®, FREEBSD®, NETBSD®, OpenBSD, Minix, Xinu, or Darwin, among others. In another example, OS 362 may be or include a portable operating system interface (POSIX) compliant operating system.

In one or more embodiments, interface 380 may include circuitry that enables communicatively coupling to one or more devices. In one example, interface 380 may include circuitry that enables communicatively coupling to one or more buses. For instance, the one or more buses may include one or more buses described herein, among others. In a second example, interface 380 may include circuitry that enables one or more interrupt signals to be received. In one instance, interface 380 may include general purpose input/output (GPIO) circuitry, and the GPIO circuitry may enable one or more interrupt signals to be received and/or provided via at least one interrupt line. In another instance, interface 380 may include GPIO circuitry that may enable EC 130 to provide and/or receive signals associated with other circuitry (e.g., diagnostic circuitry, etc.). In a third example, interface 380 may include circuitry that enables communicatively coupling to one or more networks. In one instance, interface 380 may include circuitry that enables communicatively coupling to network interface 180. In another example, interface 380 may include a network interface.

In one or more embodiments, one or more of OS 362 and APPs 364-368 may include processor instructions executable by processor 320. In one example, processor 320 may execute processor instructions of one or more of OS 362 and APPs 364-368 via non-volatile memory medium 370. In another example, one or more portions of the processor instructions of the one or more of OS 362 and APPs 364-368 may be transferred to volatile memory medium 350, and processor 320 may execute the one or more portions of the processor instructions of the one or more of OS 362 and APPs 364-368 via volatile memory medium 350. In one or more embodiments, processor 320 may execute instructions in accordance with at least a portion of one or more systems, at least a portion of one or more flowcharts, one or more methods, and/or at least a portion of one or more processes described herein. For example, non-volatile memory medium 370 and/or volatile memory medium 350 may store instructions that may be executable in accordance with at least a portion of one or more systems, at least a portion of one or more flowcharts, at least a portion of one or more methods, and/or at least a portion of one or more processes described herein. In one or more embodiments, processor 320 may execute instructions in accordance with at least a portion of one or more of systems, flowcharts, at least a portion of one or more methods, and/or at least a portion of one or more processes described herein. For example, non-volatile memory medium 370 and/or volatile memory medium 350 may store instructions that may be executable in accordance with at least a portion of one or more of systems, at least a portion of one or more flowcharts, at least a portion of one or more methods, and/or at least a portion of one or more processes described herein. In one or more embodiments, processor 320 may utilize EC data 377. In one example, processor 320 may utilize EC data 377 via non-volatile memory medium 370. In another example, one or more portions of EC data 377 may be transferred to volatile memory medium 350, and processor 320 may utilize EC data 377 via volatile memory medium 350.

Figure 4:
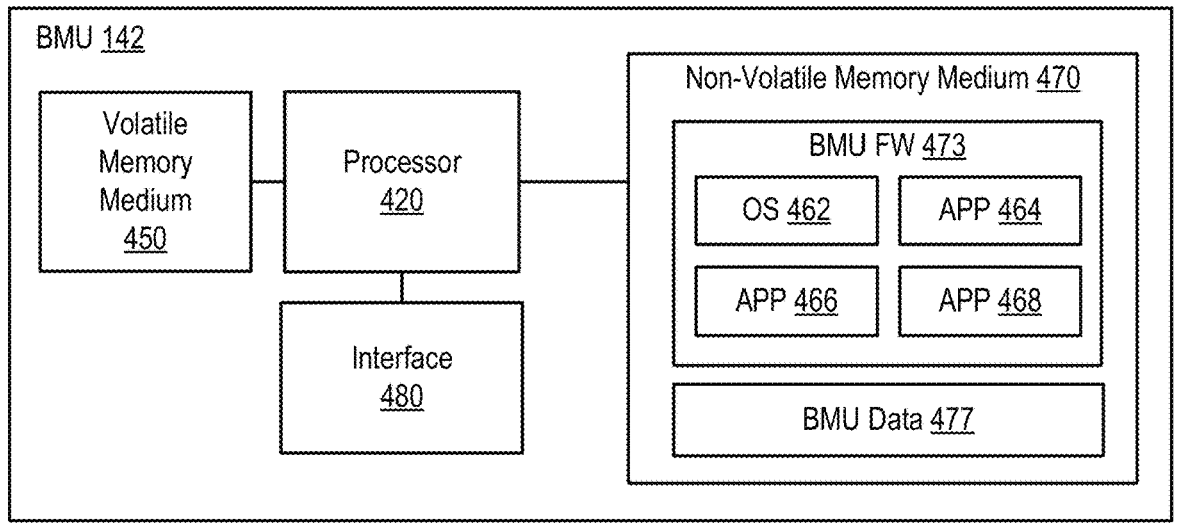
FIG. 4 illustrates an example of a microcontroller, according to one or more embodiments.

Turning now to FIG. 4, an example of a battery management unit is illustrated, according to one or more embodiments. In one or more embodiments, BMU 142 may be or include a microcontroller. For example, BMU 142 may be or include an 8051 microcontroller, an ARM Cortex-M (e.g., Cortex-M0, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. As shown, BMU 142 may include a processor 420, a volatile memory medium 450, a non-volatile memory medium 470, and an interface 480. As illustrated, non-volatile memory medium 470 may include a BMU FW 473, which may include an OS 462 and APPs 464-468, and may include BMU data 477. In one example, OS 462 may be or include RTOS. For instance, the RTOS may be or include FreeRTOS, OpenRTOS, SafeRTOS, QNX, ThreadX, VxWorks, NuttX, TI-RTOS, eCos, MicroC/OS, or Zephyr, among others. In another example, OS 462 may be or include a POSIX compliant operating system.

In one or more embodiments, interface 480 may include circuitry that enables communicatively coupling to one or more devices. In one example, interface 480 may include circuitry that enables communicatively coupling to one or more buses. For instance, the one or more buses may include one or more buses described herein, among others. In a second example, interface 480 may include circuitry that enables one or more interrupt signals to be received. In one instance, interface 480 may include GPIO circuitry, and the GPIO circuitry may enable one or more interrupt signals to be received and/or provided via at least one interrupt line. In another instance, interface 480 may include GPIO circuitry that may enable BMU 142 to provide and/or receive signals associated with other circuitry. In a third example, interface 480 may include circuitry that enables communicatively coupling to one or more networks. In another example, interface 480 may include a network interface.

In one or more embodiments, one or more of OS 462 and APPs 464-468 may include processor instructions executable by processor 420. In one example, processor 420 may execute processor instructions of one or more of OS 462 and APPs 464-468 via non-volatile memory medium 470. In another example, one or more portions of the processor instructions of the one or more of OS 462 and APPs 464-468 may be transferred to volatile memory medium 450, and processor 420 may execute the one or more portions of the processor instructions of the one or more of OS 462 and APPs 464-468 via volatile memory medium 450. In one or more embodiments, processor 420 may execute instructions in accordance with at least a portion of one or more systems, at least a portion of one or more flowcharts, one or more methods, and/or at least a portion of one or more processes described herein. For example, non-volatile memory medium 470 and/or volatile memory medium 450 may store instructions that may be executable in accordance with at least a portion of one or more systems, at least a portion of one or more flowcharts, at least a portion of one or more methods, and/or at least a portion of one or more processes described herein. In one or more embodiments, processor 420 may execute instructions in accordance with at least a portion of one or more of systems, flowcharts, at least a portion of one or more methods, and/or at least a portion of one or more processes described herein. For example, non-volatile memory medium 470 and/or volatile memory medium 450 may store instructions that may be executable in accordance with at least a portion of one or more of systems, at least a portion of one or more flowcharts, at least a portion of one or more methods, and/or at least a portion of one or more processes described herein. In one or more embodiments, processor 420 may utilize BMU data 477. In one example, processor 420 may utilize BMU data 477 via non-volatile memory medium 470. In another example, one or more portions of BMU data 477 may be transferred to volatile memory medium 450, and processor 420 may utilize BMU data 477 via volatile memory medium 450.

Figure 5A:
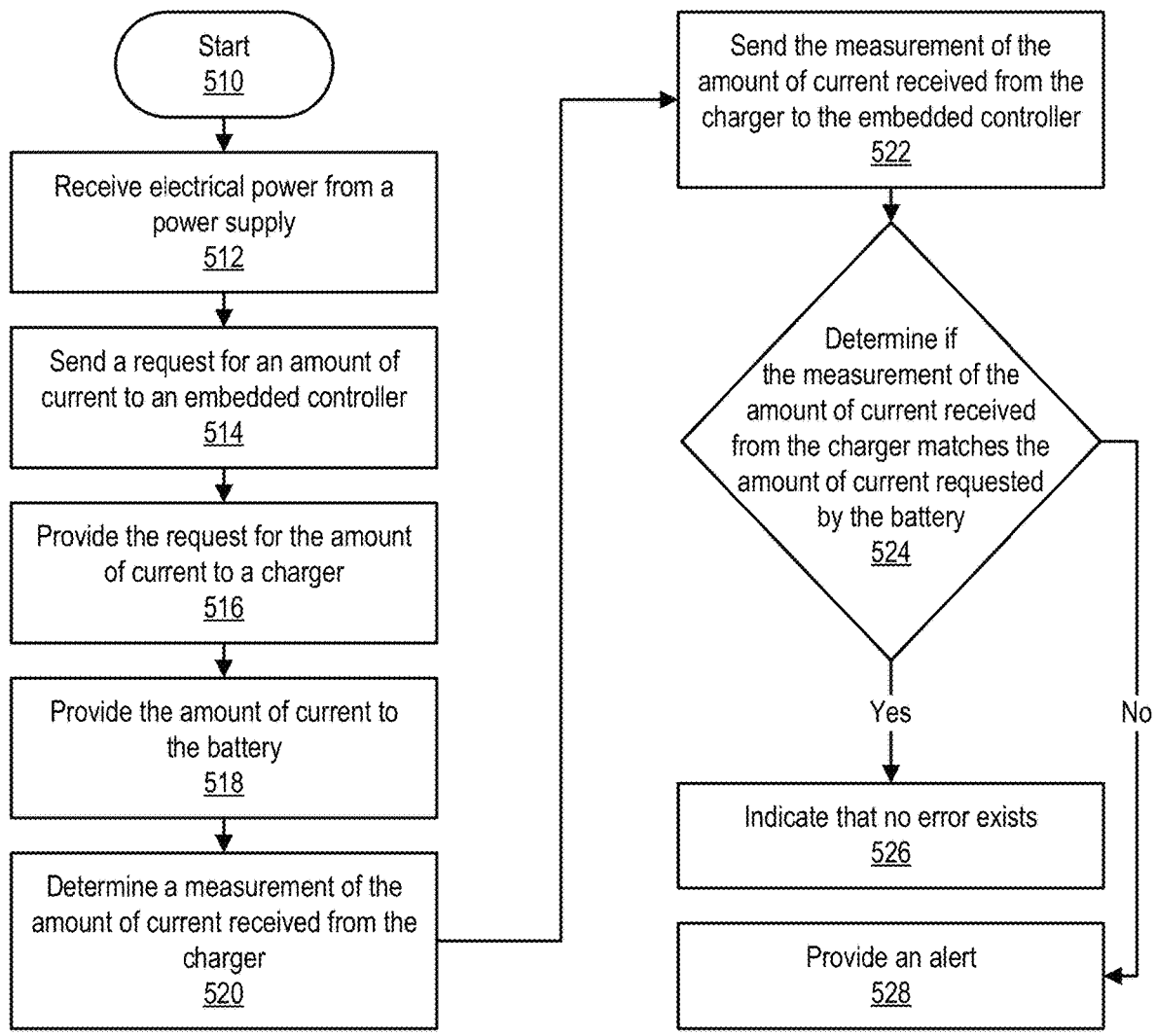
FIG. 5A illustrates an example of a method of determining if there is an issue associated with a power distribution system of an information handling system, according to one or more embodiments.

Turning now to FIG. 5A, an example of a method of determining if there is an issue associated with a power distribution system of an information handling system is illustrated, according to one or more embodiments. At 510, the method may begin. For example, an information handling system may be turned on, at 510. For instance, IHS 110 may be turned on, at 510. At 512, the information handling system may receive electrical power from a power supply. For example, IHS 110 may receive electrical power from power supply 194. For instance, when IHS 110 receives electrical power from power supply 194, at 512, processor 120, which would execute an operating system (e.g., OS 162) with a graphical user interface after booting the operating system, may not be processing instructions. As an example, IHS 110 may be in an ACPI Power Management State S5. For instance, the ACPI Power Management State S5 may be or may include a soft-off state.

At 514, a request for an amount of current may be sent to an embedded controller. For example, battery 140 may send a request for an amount of current may be sent to EC 130. For instance, BMU 142 may send a request for an amount of current may be sent to EC 130. As an example, the amount of current may include one ampere (1 A), three amperes (3 A), or five amperes (5 A), among others. At 516, the embedded controller may provide the request for the amount of current to a charger of the information handling system. For example, EC 130 may provide the request for the amount of current to charger 145. For instance, EC 130 may provide the request for the amount of current to IC 210. As an example, EC 130 may provide the request for the amount of current to charger 145 via an I²C bus or a SMBus. For instance, EC 130 may provide the request for the amount of current to IC 210 via an I²C bus or a SMBus.

At 518, the charger may provide the amount of current to the battery. For example, charger 145 may provide the amount of current to battery 140. At 520, the battery may determine a measurement of the amount of current received from the charger. For example, battery 140 may determine a measurement of the amount of current received from charger 145. For instance, BMU 142 may determine a measurement of the amount of current received from charger 145. At 522, the battery may send the measurement of the amount of current received from the charger to the embedded controller. In one example, battery 140 may send the measurement of the amount of current received from charger 145 to EC 130. For instance, battery 140 may send the measurement of the amount of current received from charger 145 to EC 130 via an I²C bus or a SMBus. In another example, BMU 142 may send the measurement of the amount of current received from charger 145 to EC 130. For instance, BMU 142 may send the measurement of the amount of current received from charger 145 to EC 130 via an I²C bus or a SMBus.

At 524, it may be determined if the measurement of the amount of current received from the charger matches the amount of current requested by the battery. For example, EC 130 may determine the measurement of the amount of current received from charger 145 matches the amount of current requested by battery 140. In one or more embodiments, determining if the measurement of the amount of current received from the charger matches the amount of current requested by the battery may include determining if the measurement of the amount of current received from the charger is within a tolerance amount of current of the amount of current requested by the battery. For example, the tolerance amount of current may be from one milliampere (1 mA) to ten milliamperes (10 mA), among others. If the measurement of the amount of current received from the charger matches the amount of current requested by the battery, it may be indicated that no error exists, at 526. For example, EC 130 may indicate that no error exists. If the measurement of the amount of current received from the charger does not match the amount of current requested by the battery, an alert may be provided, at 528. For example, EC 130 may provide an alert. For instance, the alert may include a pop up message, which may be displayed via a display associated with IHS 110.

Figure 5B:
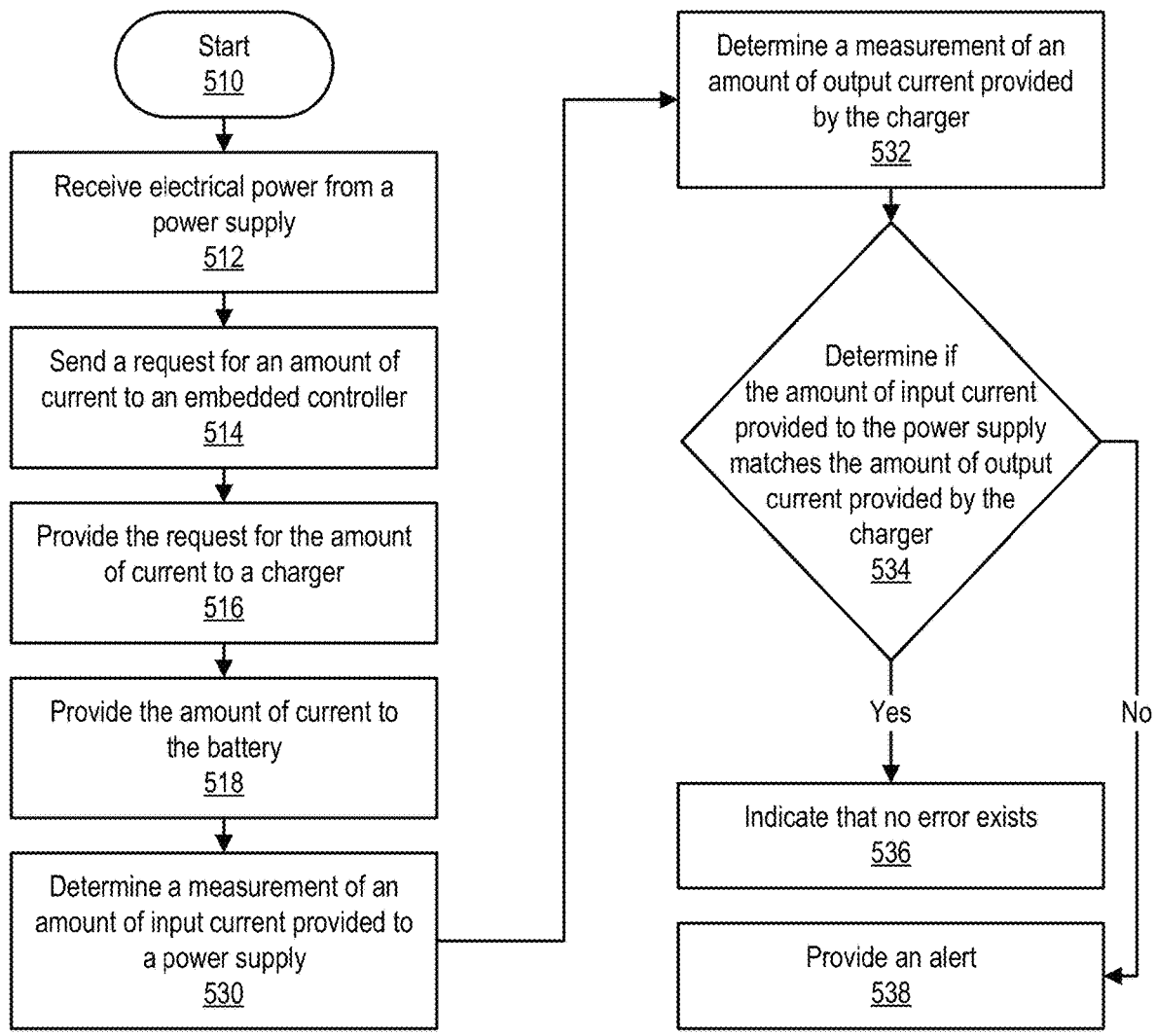
FIG. 5B illustrates another example of a method of determining if there is an issue associated with a power distribution system of an information handling system, according to one or more embodiments.

Turning now to FIG. 5B, another example of a method of determining if there is an issue associated with a power distribution system of an information handling system is illustrated, according to one or more embodiments. In one or more embodiments, method elements 510-518 of FIG. 5B may be performed in accordance with method elements 510-518 of FIG. 5A. At 530, a measurement of an amount of input current provided to a power supply may be determined. For example, power supply 194 may determine a measurement of an amount of input current provided to power supply 194. At 532, a measurement of an amount of output current provided by the charger may be determined. For example, charger 145 may determine a measurement of an amount of output current provided by charger 145.

At 534, it may be determined if the amount of input current provided to the power supply matches the amount of output current provided by the charger. For example, charger 145 may determine if the amount of input current provided to the charger matches the amount of output current provided by power supply 192. In one or more embodiments, determining if the amount of input current provided to the power supply matches the amount of output current provided by the charger may include the amount of input current provided to the power supply is within a tolerance amount of current of the amount of output current provided by the charger. For example, the tolerance amount of current may be from one milliampere (1 mA) to ten milliamperes (10 mA), among others. If the amount of input current provided to the charger matches the amount of output current provided by the power supply, it may be indicated that no error exists, at 536. For example, charger 145 may indicate that no error exists. For instance, charger 145 may indicate that no error exists to EC 130. As an example, EC 130 may indicate that no error exists. If the amount of input current provided to the charger does not match the amount of output current provided by the charger, an alert may be provided, at 538. For example, charger 145 may an alert. For instance, charger 145 may an alert to EC 130. As an example, in response to receiving the alert from charger 145, EC 130 may cause a pop up message to be displayed via a display associated with IHS 110.

Figure 6A:
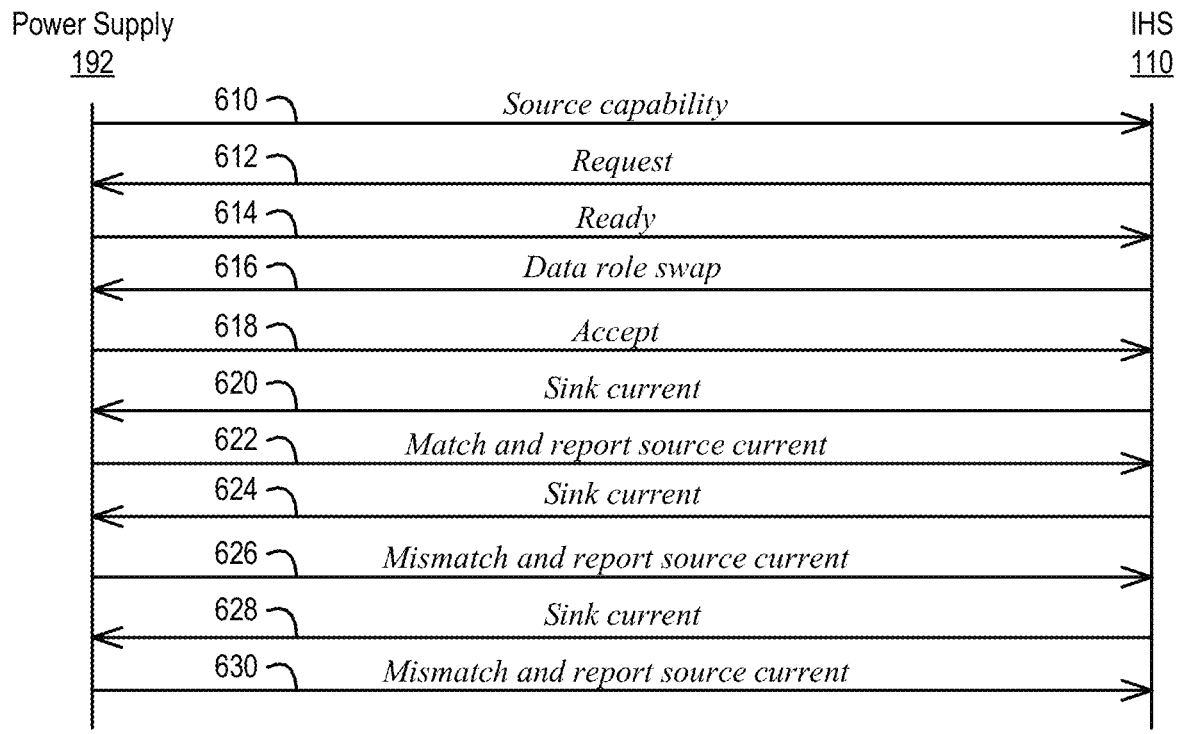
FIG. 6A illustrates an example of a sequence diagram of a power supply interacting with an information handling system, according to one or more embodiments.
Figure 6A:
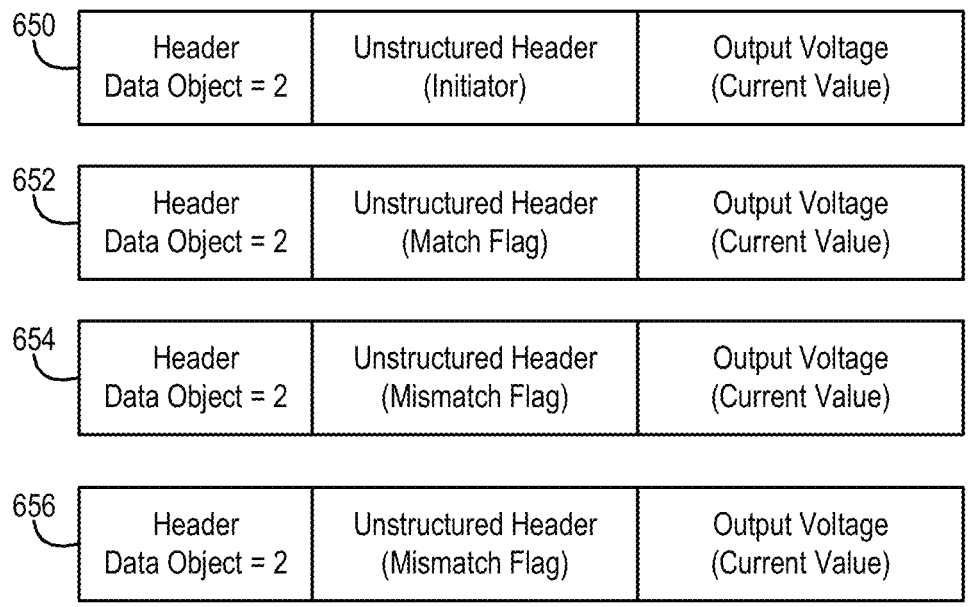

Turning now to FIG. 6A, an example of a sequence diagram of a power supply interacting with an information handling system is illustrated, according to one or more embodiments. At 610, power supply 194 may provide a source capability to IHS 110. At 612, IHS 110 may provide a request to power supply 194. For example, the request may request electrical power from power supply 194. At 614, power supply 194 may provide information to IHS 110, indicating that power supply 194 is ready to supply electrical power to IHS 110. At 616, IHS 110 may provide a data role swap command to power supply 194. At 618, power supply 194 may accept the data role swap command. At 620, IHS 110 may sink a first electrical current from power supply 194. For example, the first electrical current may be four and one half amperes (4.5 A). For instance, IHS 110 may provide a data packet 650 to power supply 194.

Figure 6B:
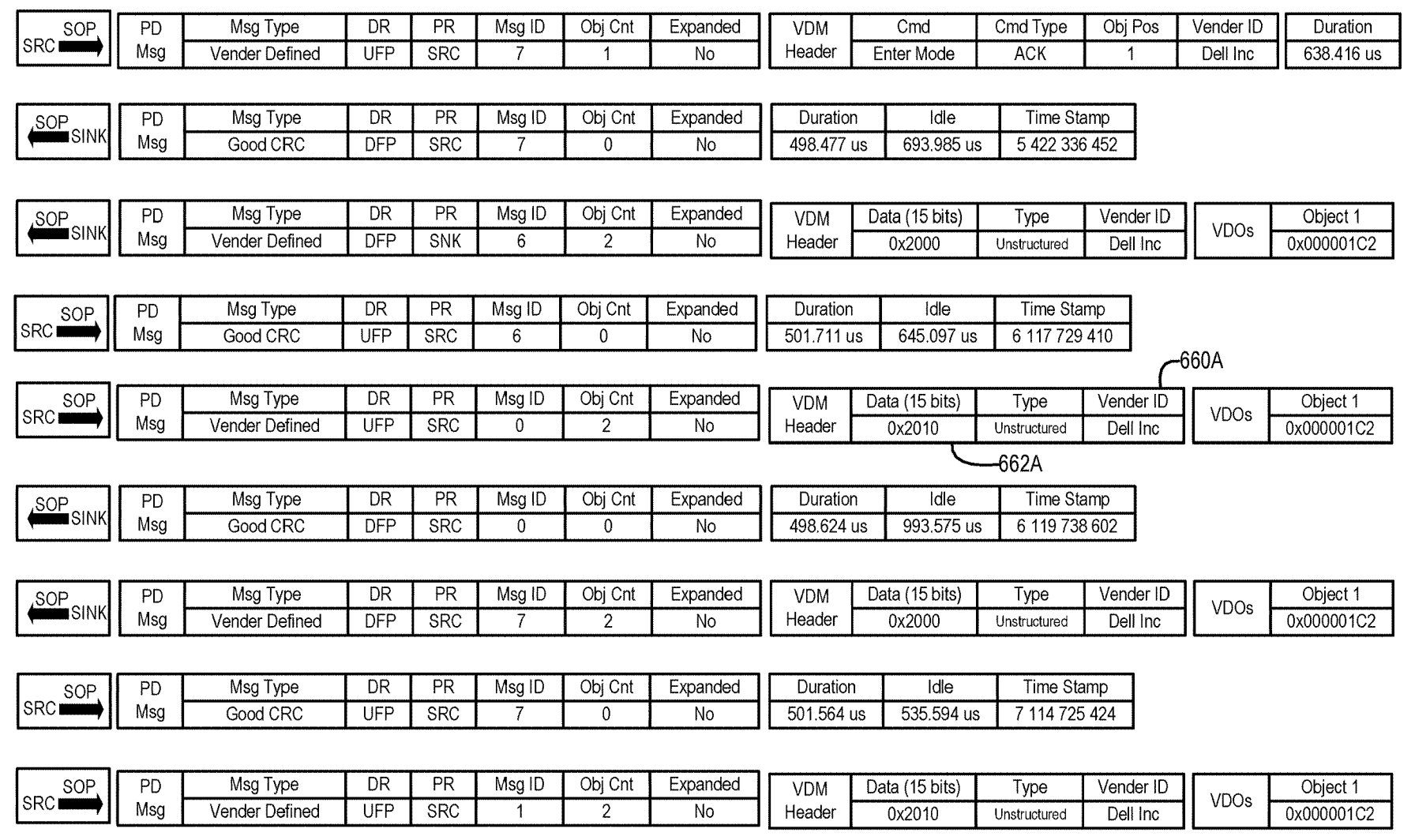
Figure 6C:

At 622, power supply 194 may match and report source current to IHS 110. In one example, power supply 194 may provide a report of four and one half amperes (4.5 A) and a data packet 652 to IHS 110. In another example, power supply 194 may provide a data packet 660A, as shown in FIG. 6B, to IHS 110. For instance, data packet 660A may include a payload 662A, which may indicate a match. At 624, IHS 110 may sink a second electrical current from power supply 194. For example, the second electrical current may be three and one half amperes (3.5 A). At 626, power supply 194 may mismatch and report source current to IHS 110. In one example, power supply 194 may provide a data packet 654 to IHS 110. In another example, power supply 194 may provide a data packet 660B, as shown in FIG. 6C, to IHS 110. For instance, data packet 660B may include a payload 662B, which may indicate a mismatch. At 628, IHS 110 may sink a third electrical current from power supply 194. For example, the second electrical current may be five amperes (5 A). At 630, power supply 194 may mismatch and report source current to IHS 110. In one example, power supply 194 may provide a data packet 656 to IHS 110. In one example, power supply 194 may provide a data packet 660C, as shown in FIG. 6C, to IHS 110. For instance, data packet 660C may include a payload 662C, which may indicate a mismatch.

Figure 7A:
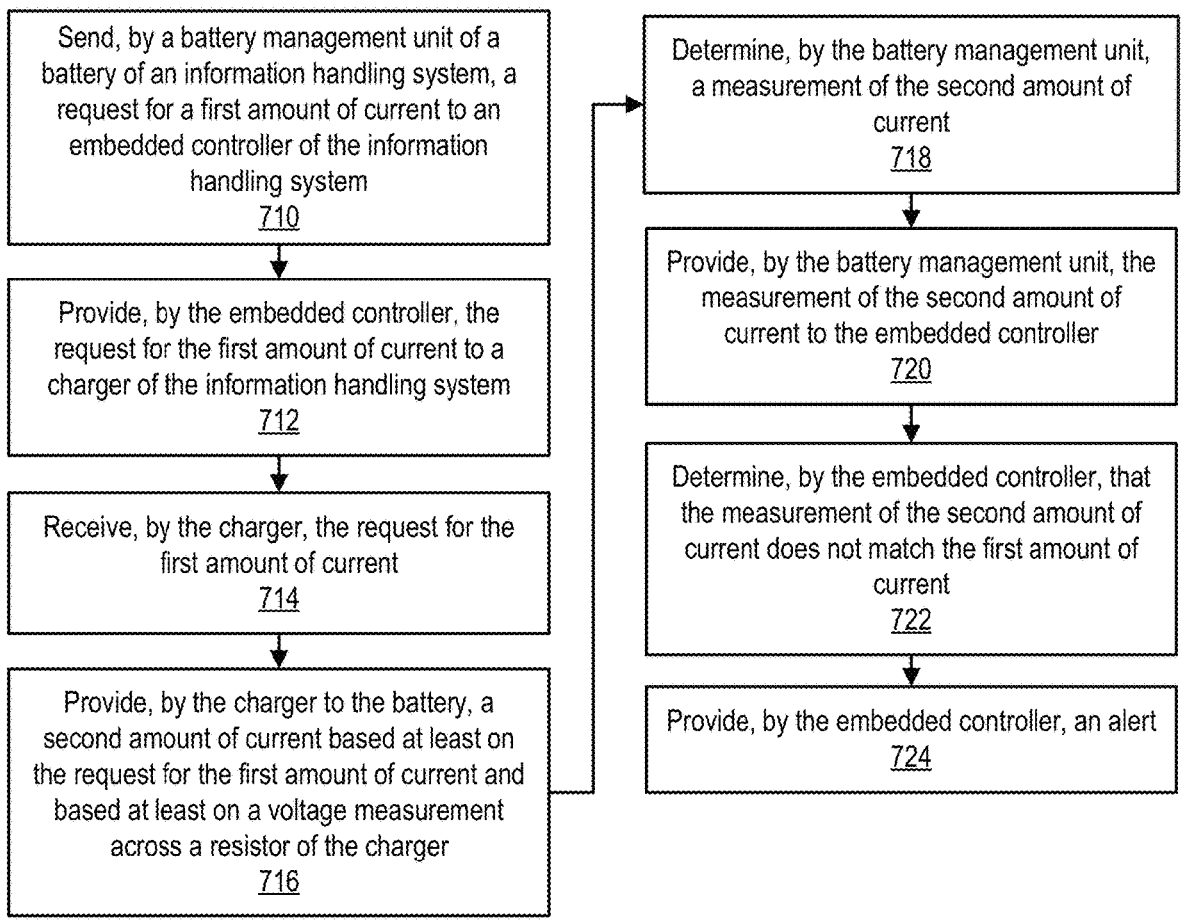
FIG. 7A illustrates an example of FIG. 7A, an example of determining an issue associated with a power distribution system of an information handling system, according to one or more embodiments.

Turning now to FIG. 7A, an example of determining an issue associated with a power distribution system of an information handling system is illustrated, according to one or more embodiments. At 710, a battery management unit of a battery of an information handling system may send a request for a first amount of current to an embedded controller of the information handling system. For example, battery management unit 142 of battery 140 of IHS 110 may send a request for a first amount of current to EC 130 of IHS 110.

At 712, the embedded controller may provide the request for the first amount of current to a charger of the information handling system. For example, EC 130 may provide the request for the first amount of current to charger 145 of IHS 110. In one or more embodiments, providing the request for the amount of current to the charger may include providing the request for the amount of current to the charger via an I²C bus of a SMBus. At 714, the charger may receive the request for the first amount of current. For example, charger 145 may receive the request for the first amount of current.

At 716, the charger may provide, to the battery, a second amount of current based at least on the request for the first amount of current and based at least on a voltage measurement across a resistor of the charger. For example, charger 145 may provide a second amount of current based at least on the request for the first amount of current and based at least on a voltage measurement across a resistor 220 of charger 145. For instance, the voltage measurement across resistor 220 may be based at least on a voltage measurement across traces 250A and 250B of PCB 240. In one or more embodiments, resistor 220 may be a sense resistor or a shunt resistor, among others. In one or more embodiments, the charger may determine the voltage measurement across the resistor of the charger. For example, charger 145 may determine the voltage measurement across resistor 220 of charger 145.

At 718, the battery management unit may determine a measurement of the second amount of current. For example, BMU 142 may determine a measurement of the second amount of current. At 720, the battery management unit may provide the measurement of the second amount of current to the embedded controller. For example, BMU 142 may provide the measurement of the second amount of current to EC 130. For instance, BMU 142 may provide the measurement of the second amount of current to EC 130 via an I²C bus of a SMBus.

At 722, the embedded controller may determine that the measurement of the second amount of current does not match the first amount of current. For example, EC 130 may determine that the measurement of the second amount of current does not match the first amount of current. In one or more embodiments, determining that the measurement of the second amount of current does not match the first amount of current may include determining that the measurement of the second amount of current is outside a range of a tolerance of the first amount of current. For example, the tolerance of the first amount of current may be plus or minus a range (e.g., plus or minus zero milliamperes (0 mA) to ten milliamperes (10 mA)). For instance, determining that the measurement of the second amount of current does not match the first amount of current may include determining that the measurement of the second amount of current is not within plus or minus a third amount of current. As an example, the third amount of current may be ten milliamperes (10 mA). In one instance, determining that the measurement of the second amount of current does not match the first amount of current may include determining that the measurement of the second amount of current is above the third amount of current or is below the third amount of current.

At 724, the embedded controller may provide an alert. For example, EC 130 may provide an alert. In one or more embodiments, providing the alert may be performed in response to determining that the measurement of the second amount of current does not match the first amount of current. For example, EC 130 may provide the alert in response to determining that the measurement of the second amount of current does not match the first amount of current.

In one or more embodiments, a processor of the information handling system, which would execute an operating system with a graphical user interface after booting the operating system, is not processing instructions. For example, processor 120 of IHS 110, which would execute OS 162 with a graphical user interface after booting OS 162, is not processing instructions. For instance, processor 120 of IHS 110, which would execute OS 162 with a graphical user interface after booting OS 162, is not processing instructions before EC 130 provides the alert. In one or more embodiments, the processor of the information handling system, which would execute the operating system with the graphical user interface after booting the operating system, is not processing instructions during the method illustrated in FIG. 7. For example, processor 120 of IHS 110, which would execute OS 162 with a graphical user interface after booting OS 162, is not processing instructions during the method illustrated in FIG. 7. In one or more embodiments, the method illustrated in FIG. 7 before processor 120 boots OS 162.

In one or more embodiments, the alert may indicate a problem associated with the charger. For example, the alert may indicate a problem associated with charger 145. In one or more embodiments, the alert may indicate a problem associated with the resistor of the charger. For example, the alert may indicate a problem associated with resistor 220 of charger 145. In one or more embodiments, the charger may determine the second amount of current. For example, charger 145 may determine the second amount of current. In one or more embodiments, the charger may determine that the measurement of the second amount of current does not match the first amount of current. For example, charger 145 may determine that the measurement of the second amount of current does not match the first amount of current. In one or more embodiments, the charger may provide the alert. For example, charger 145 may provide the alert. For instance, charger 145 may provide the alert in response to charger 145 determining that the measurement of the second amount of current does not match the first amount of current.

Figure 7B:
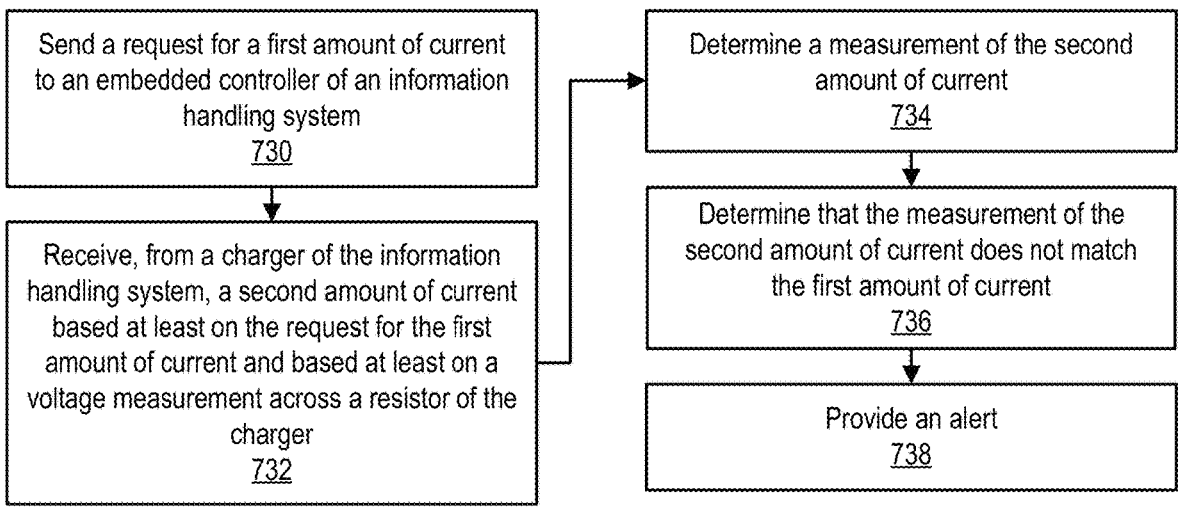
FIG. 7B illustrates an example of a method of operating a battery management unit, according to one or more embodiments.

Turning now to FIG. 7B, an example of a method of operating a battery management unit is illustrated, according to one or more embodiments. At 730, a battery management unit may send a request for a first amount of current to an embedded controller of an information handling system. For example, BMU 142 may send a request for a first amount of current to EC 130 of IHS 110. At 732, the battery management unit may receive, from a charger of the information handling system, a second amount of current based at least on the request for the first amount of current and based at least on a voltage measurement across a resistor of the charger. For example, BMU 142 may receive, from charger 145 of IHS 110, a second amount of current based at least on the request for the first amount of current and based at least on a voltage measurement across a resistor 220 of charger 145.

At 734, the battery management unit may determine a measurement of the second amount of current. For example, BMU 142 may determine a measurement of the second amount of current. At 736, the battery management unit may determine that the measurement of the second amount of current does not match the first amount of current. For example, BMU 142 may determine that the measurement of the second amount of current does not match the first amount of current. In one or more embodiments, determining that the measurement of the second amount of current does not match the first amount of current may include determining that the measurement of the second amount of current is outside a range of a tolerance of the first amount of current. For example, the tolerance of the first amount of current may be plus or minus a range (e.g., plus or minus zero milliamperes (0 mA) to ten milliamperes (10 mA)). For instance, determining that the measurement of the second amount of current does not match the first amount of current may include determining that the measurement of the second amount of current is not within plus or minus a third amount of current. As an example, the third amount of current may be ten milliamperes (10 mA). In one instance, determining that the measurement of the second amount of current does not match the first amount of current may include determining that the measurement of the second amount of current is above the third amount of current or is below the third amount of current. At 738, the battery management unit may provide an alert. For example, BMU 142 may provide an alert. For instance, BMU 142 may provide the alert to EC 130. In one or more embodiments, provide the alert may be performed in response to determining that the measurement of the second amount of current does not match the first amount of current.

In one or more embodiments, one or more of the method and/or process elements and/or one or more portions of a method and/or a process element may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with at least a portion of one or more flowcharts, at least a portion of one or more systems, at least a portion of one or more methods, and/or at least a portion of one or more processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system, comprising:
   an embedded controller;
   a battery that include a plurality of cells and a battery management unit, which is coupled to the embedded controller; and
   a charger coupled to the embedded controller and the battery;
   wherein the battery management unit is configured to send a request for a first amount of current to the embedded controller;
   wherein the embedded controller is configured to provide the request for the first amount of current to the charger;
   wherein the charger is configured to:
   receive the request for the first amount of current; and
   provide, to the battery, a second amount of current based at least on the request for the first amount of current and based at least on a voltage measurement across a resistor of the charger;
   wherein the battery management unit is further configured to:
   determine a measurement of the second amount of current; and
   provide the measurement of the second amount of current to the embedded controller; and
   wherein the embedded controller is further configured to:
   determine that the measurement of the second amount of current does not match the first amount of current; and
   in response to determining that the measurement of the second amount of current does not match the first amount of current, provide an alert.

2. The information handling system of claim 1, further comprising:
   at least one processor; and
   a memory medium, coupled to the at least one processor, that stores an operating system with a graphical user interface executable by the at least one processor;
   wherein the at least one processor does not boot the operating system before the embedded controller provides the alert.

3. The information handling system of claim 1, further comprising:
   an inter-integrated circuit (I²C) bus;
   wherein, to provide the request for the amount of current to the charger, the embedded controller is further configured to provide the request for the amount of current to the charger via the I²C bus.

4. The information handling system of claim 1, wherein the alert indicates a problem associated with the resistor of the charger.

5. The information handling system of claim 1, wherein the charger is further configured to determine the voltage measurement across the resistor of the charger.

6. The information handling system of claim 1, wherein the charger is further configured to:
   determine the measurement of the second amount of current;
   determine that the measurement of the second amount of current does not match the first amount of current; and
   in response to determining that the measurement of the second amount of current does not match the first amount of current, provide the alert.

7. The information handling system of claim 1, wherein, to determine that the measurement of the second amount of current does not match the first amount of current, the embedded controller is further configured to determine that the measurement of the second amount of current is outside a range of a tolerance of the first amount of current.

8. A method, comprising:
   sending, by a battery management unit of a battery of an information handling system, a request for a first amount of current to an embedded controller of the information handling system;
   providing, by the embedded controller, the request for the first amount of current to a charger of the information handling system;
   receiving, by the charger, the request for the first amount of current;
   providing, by the charger to the battery, a second amount of current based at least on the request for the first amount of current and based at least on a voltage measurement across a resistor of the charger;

determining, by the battery management unit, a measurement of the second amount of current;

providing, by the battery management unit, the measurement of the second amount of current to the embedded controller;

determining, by the embedded controller, that the measurement of the second amount of current does not match the first amount of current; and in response to the determining that the measurement of the second amount of current does not match the first amount of current, providing, by the embedded controller, an alert.

9. The method of claim 8, wherein a processor of the information handling system, which would execute an operating system with a graphical user interface after booting the operating system, is not processing instructions.

10. The method of claim 8, wherein the providing the request for the amount of current to the charger includes providing the request for the amount of current to the charger via an inter-integrated circuit (I²C) bus.

11. The method of claim 8, wherein the alert indicates a problem associated with the resistor of the charger.

12. The method of claim 8, further comprising:
determining, by the charger, the voltage measurement across the resistor of the charger.

13. The method of claim 8, further comprising:
determining, by the charger, the measurement of the second amount of current;
determining, by the charger, that the measurement of the second amount of current does not match the first amount of current; and
in response to the determining, by the charger, that the measurement of the second amount of current does not match the first amount of current, providing, by the charger, the alert.

14. The method of claim 8, wherein the determining that the measurement of the second amount of current does not match the first amount of current includes determining that the measurement of the second amount of current is outside a range of a tolerance of the first amount of current.

15. A battery management unit, comprising:
a processor; and
a memory medium, coupled to the processor, that stores instructions executable by the processor, which when executed by the processor, cause the battery management unit to:
send a request for a first amount of current to an embedded controller of an information handling system;
receive, from a charger of the information handling system, a second amount of current based at least on the request for the first amount of current and based at least on a voltage measurement across a resistor of the charger;
determine a measurement of the second amount of current;
determine that the measurement of the second amount of current does not match the first amount of current; and
in response to determining that the measurement of the second amount of current does not match the first amount of current, provide an alert.

16. The battery management unit of claim 15, wherein, to provide the alert, the instructions further cause the battery management unit to further provide the alert before a processor of the information handling system boots an operating system with a graphical user interface.

17. The battery management unit of claim 15, wherein, to send the request for the first amount of current to the embedded controller, the instructions further cause the battery management unit to further send the request for the first amount of current to the embedded controller via an inter-integrated circuit (I²C) bus.

18. The battery management unit of claim 15, wherein the alert indicates a problem associated with the resistor of the charger.

19. The battery management unit of claim 15, wherein, to determine that the measurement of the second amount of current does not match the first amount of current, the instructions further cause the battery management unit to further determine that the measurement of the second amount of current is outside a range of a tolerance of the first amount of current.

20. The battery management unit of claim 15, wherein, to provide the alert, the instructions further cause the battery management unit to further provide the alert to the embedded controller.

\* \* \* \* \*